(12) United States Patent
Zhou et al.

(10) Patent No.: US 11,997,838 B2
(45) Date of Patent: May 28, 2024

(54) POWER DEVICE ASSEMBLIES AND METHODS OF FABRICATING THE SAME

(71) Applicant: Toyota Motor Engineering & Manufacturing North America Inc., Plano, TX (US)

(72) Inventors: Feng Zhou, Ann Arbor, MI (US); Yanghe Liu, Ann Arbor, MI (US); Hiroshi Ukegawa, South Lyon, MI (US)

(73) Assignee: TOYOTA MOTOR ENGINEERING & MANUFACTURING NORTH AMERICA, INC., Plano, TX (US)

( * ) Notice: Subject to any disclaimer, the term of this patent is extended or adjusted under 35 U.S.C. 154(b) by 160 days.

(21) Appl. No.: 17/590,232

(22) Filed: Feb. 1, 2022

(65) Prior Publication Data

US 2023/0247807 A1 Aug. 3, 2023

(51) Int. Cl.
*H05K 7/20* (2006.01)
*H01L 23/367* (2006.01)

(52) U.S. Cl.
CPC ..... *H05K 7/20918* (2013.01); *H01L 23/3677* (2013.01); *H05K 7/20509* (2013.01)

(58) Field of Classification Search
CPC ............ H05K 7/20918; H05K 7/20509; H01L 23/3677; H01L 21/50; H01L 23/3672; H01L 23/3736; H01L 23/3735
See application file for complete search history.

(56) References Cited

U.S. PATENT DOCUMENTS

| | | | |
|---|---|---|---|
| 6,906,404 B2 | 6/2005 | Maly et al. | |
| 8,102,652 B2 * | 1/2012 | Toh | H01L 23/4006 174/15.1 |
| 8,872,328 B2 * | 10/2014 | Delgado | H01L 23/13 257/E23.08 |
| 9,204,579 B2 * | 12/2015 | Jaskari | H05K 7/20927 |
| 10,211,122 B2 * | 2/2019 | Kato | H01L 23/473 |

(Continued)

FOREIGN PATENT DOCUMENTS

| | | |
|---|---|---|
| CN | 106714514 A | 5/2017 |
| CN | 109346448 B | 6/2020 |

(Continued)

*Primary Examiner* — Jacob R Crum
*Assistant Examiner* — Matthew Sinclair Muir
(74) *Attorney, Agent, or Firm* — DINSMORE & SHOHL LLP

(57) ABSTRACT

Disclosed herein are apparatus and methods for a power electronics assembly that includes a cold plate assembly and one or more power device assemblies. The cold plate assembly has a manifold having a heat sink cavity in a first surface and a heat sink that includes one or more substrate cavities. The heat sink is positioned in the heat sink cavity. The one or more power device assemblies are positioned within the one or more substrate cavities. Each power device assembly includes an S-cell, a power device, and a direct bonded metal substrate bonded to the S-Cell. The S-cell includes a base layer constructed at least of graphite or a graphite-composite, a conductive layer at least partially surrounding the base layer, and a power device cavity. The power device is positioned in the power device cavity and is electrically coupled to the conductive layer.

16 Claims, 8 Drawing Sheets

(56) References Cited

U.S. PATENT DOCUMENTS

| | | | | |
|---|---|---|---|---|
| 2003/0133319 A1* | 7/2003 | Radosevich | .......... | H02M 7/003 |
| | | | | 363/141 |
| 2005/0121180 A1 | 6/2005 | Marsala | | |
| 2011/0031608 A1* | 2/2011 | Kim | ...................... | H01L 23/142 |
| | | | | 257/692 |
| 2013/0113074 A1* | 5/2013 | Ebersberger | ........... | H01G 2/106 |
| | | | | 257/532 |
| 2014/0138075 A1* | 5/2014 | Yang | .................... | H01L 23/473 |
| | | | | 165/185 |
| 2017/0341638 A1* | 11/2017 | Sawada | ................... | H01L 25/16 |

FOREIGN PATENT DOCUMENTS

| | | |
|---|---|---|
| DE | 102013109532 B3 | 8/2014 |
| WO | 2016054333 A1 | 4/2016 |

* cited by examiner

POWER DEVICE ASSEMBLIES AND METHODS OF FABRICATING THE SAME

TECHNICAL FIELD

The present specification generally relates to apparatus and methods for power electronic assemblies and, more specifically, apparatus and methods for power electronic assemblies having enhanced heat spreading and improved assembly alignment.

BACKGROUND

Due to the increased use of electronics in vehicles, there is a need to make electronic systems more compact. One component of these electronic systems is a power electronic device used as a switch in an inverter. Power electronic devices have large cooling requirements due to the heat generated. For these reasons, and more, there is a need to improve the cooling of power electronic devices and the assembly alignment of the power electronics devices while maintaining a compact package size.

SUMMARY

In one embodiment, an apparatus for a power electronics assembly includes a cold plate assembly and one or more power device assemblies. The cold plate assembly has a manifold and a heat sink. The manifold has a heat sink cavity in a first surface. The heat sink includes one or more substrate cavities. The heat sink is positioned in the heat sink cavity. The one or more power device assemblies are positioned within the one or more substrate cavities. Each power device assembly of the one or more power device assemblies includes an S-cell, a power device, and a direct bonded metal (DBM) substrate bonded to the S-Cell. The S-cell includes a base layer constructed at least of graphite or a graphite-composite, a conductive layer at least partially surrounding the base layer, and a power device cavity. The power device is positioned in the power device cavity and is electrically coupled to the conductive layer.

In another embodiment, a power device assembly includes an S-cell, one or more power devices, and a direct bonded metal (DBM) substrate bonded to the S-cell. The S-cell has a base layer constructed at least of graphite or a graphite-composite, a conductive layer at least partially surrounding the base layer, and one or more power device cavities. The one or more power devices are each positioned in the one of the one or more power device cavities. Each of the one or more power devices is electrically coupled to the conductive layer.

In yet another embodiment, a method of forming a power electronics assembly is shown. The method includes positioning a heat sink into a heat sink cavity on a first surface of a cold plate manifold, where the heat sink includes one or more substrate cavities. The method further includes embedding one or more power device assemblies within the one or more substrate cavities, where each power device assembly includes an S-cell having a base layer constructed at least of graphite or a graphite-composite, a conductive layer at least partially surrounding the base layer, and a power device cavity. The method further includes placing a bonding layer at least partially within the power device cavity. The method further includes bonding a power device to the power device cavity via the bonding layer, the power device being electrically coupled to the S-cell.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Figure 1:
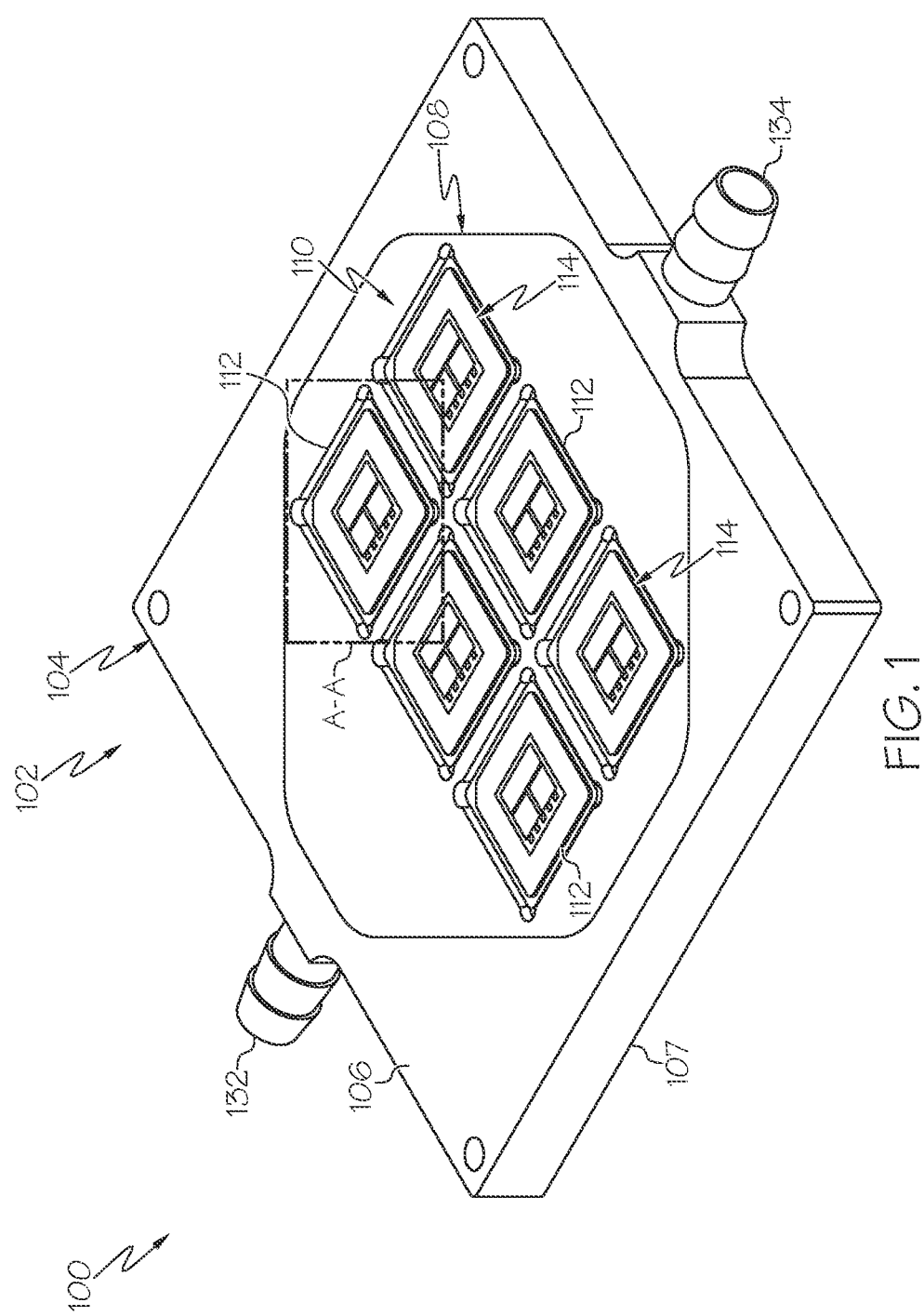
FIG. 1 schematically depicts a perspective view of an illustrative power electronics assembly including a plurality of embedded power device assemblies, according to one or more embodiments shown and described herein.

Embodiments described herein are generally directed to power electronics assemblies having S-cells constructed at least partially of graphite or graphite-composite. The S-cell has a power device cavity where a power electronics device is placed. Due to the S-cell being constructed at least partially of graphite or graphite-composite, the power electronics device is able to spread more heat through the S-cell and is also able to cool more effectively when compared to conventional approaches. Additionally, due to the S-cell being constructed at least partially of graphite or graphite-composite, the S-cell defines more precise tolerancing, resulting in less assembly misalignment when compared to conventional approaches. The power device cavity is designed so that a top surface of the power electronics device is flush with a top surface of the cold plate assembly, while allowing the power electronics device to be electrically coupled to a bottom electrode of the S-cell. The flat surface allows for a printed circuit board (PCB) to be printed directly upon the cold plate assembly. Due to the proximity of the heat-generating power electronics device to the cold plate there may be improved cooling for the power electronics assembly. This allows for the power electronics device to output higher power, while maintaining a compact package size.

Ranges can be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

Directional terms as used herein—for example up, down, right, left, front, back, top, bottom—are made only with reference to the figures as drawn and are not intended to imply absolute orientation.

Unless otherwise expressly stated, it is in no way intended that any method set forth herein be construed as requiring that its steps be performed in a specific order, nor that with any apparatus specific orientations be required. Accordingly, where a method claim does not actually recite an order to be followed by its steps, or that any apparatus claim does not actually recite an order or orientation to individual components, or it is not otherwise specifically stated in the claims or description that the steps are to be limited to a specific order, or that a specific order or orientation to components of an apparatus is not recited, it is in no way intended that an order or orientation be inferred, in any respect. This holds for any possible non-express basis for interpretation, including: matters of logic with respect to arrangement of steps, operational flow, order of components, or orientation of components; plain meaning derived from grammatical organization or punctuation, and; the number or type of embodiments described in the specification.

As used herein, the singular forms "a," "an" and "the" include plural referents unless the context clearly dictates otherwise. Thus, for example, reference to "a" component includes aspects having two or more such components, unless the context clearly indicates otherwise.

In conventional systems, S-cells may be limited in their ability to dissipate heat, which may result in insufficient cooling of the power device. This may result in limiting the output of the power devices. Further, a fabrication accuracy of an S-cell may be limited when the S-cell is fabricated through etching. Reduced fabrication accuracy may result in PCB vias to be misaligned to the signal pads of the power device after assembly. Various embodiments of power electronics assemblies, methods of fabricating power electronic assemblies, and the operation of power electronic assemblies are described in more detail herein. The power electronics assemblies described herein may have improved heat spreading to improve cooling of the power device. The power electronics assemblies may also have S-cells having an improved fabrication accuracy to reduce misalignment of the power electronics assembly when assembled. Whenever possible, the same reference numerals will be used throughout the drawings to refer to the same or like parts.

Each structure shown and described herein provides advantages over conventional structures (e.g., power electronics assemblies) due to the compact package size, increased thermal spreading, improved fabrication accuracy, improved assembly tolerances, and better flow distribution, which all result in a higher cooling capacity. In addition, the structures shown and described herein may also be deployable in non-traditional spaces and/or be integrated with existing components. For example, the structures shown and described herein may be integrated with a motor cooling system (e.g., in-wheel motors) or other systems that use a coolant such that the coolant can be used for more than one purpose.

Figure 2:
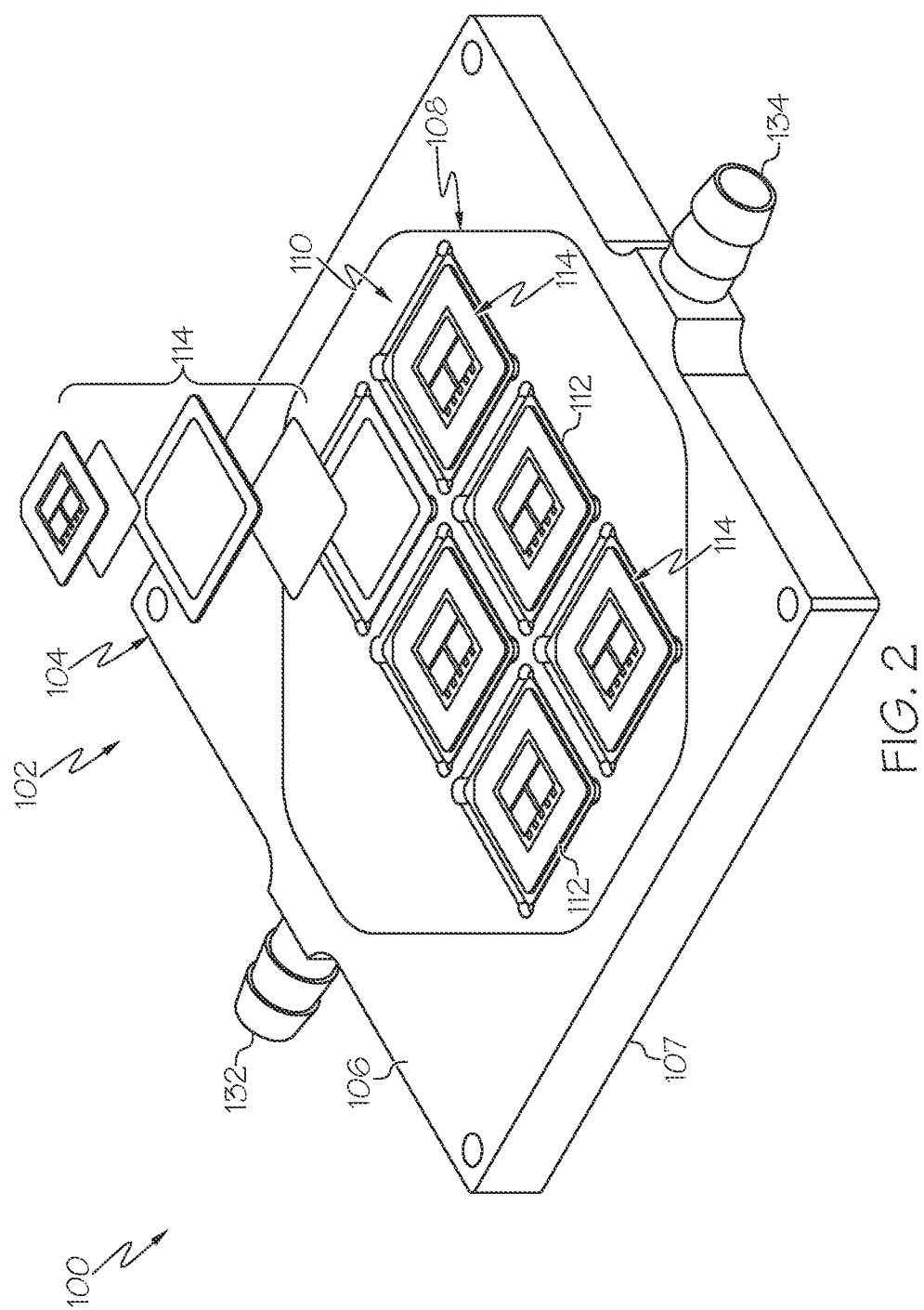
FIG. 2 schematically depicts a perspective view of power electronics assembly embedded with an exploded view of an embedded power device assembly, according to one or more embodiments shown and described herein.

Referring now to FIGS. 1-2, an example power electronics assembly 100 is illustrated according to one or more embodiments described herein. Particularly, FIG. 1 depicts a power electronics assembly 100 including a plurality of power device assemblies 114 in an assembled configuration, whereas FIG. 2 depicts the power electronics assembly 100 with an individual power device assembly of the plurality of power device assemblies 114 shown in an exploded view.

In some embodiments, the example power electronics assembly 100 is utilized in an electric vehicle. In other embodiments, the power electronics assembly 100 is used in an electrically driven device, such as and without being limited to, a hybrid vehicle, any electric motor, generators, industrial tools, household appliances, and the like. The power electronics assembly 100 may be electrically coupled to an electric motor and/or a battery and is configured to receive power from the electric motor and/or battery.

The example power electronics assembly 100 may include a cold plate assembly 102 configured to house power device assemblies 114 embedded into the cold plate assembly 102, while absorbing the heat generated by the power device assemblies 114. As discussed in greater detail herein, the cold plate assembly 102 receives coolant that may absorb the heat generated by the power device assemblies 114 and provide that coolant to a downstream cooling system. In this way, the cold plate assembly 102 is able to remove heat from the power electronics assembly 100 in an efficient manner. The cold plate assembly 102 may be machined, forged, extruded, or cast from a block of thermally conductive material. In some embodiments, the cold plate assembly 102 is 3D printed.

The example cold plate assembly 102 may include a manifold 104 (e.g., a manifold plate). The manifold 104 is configured to receive and provide coolant to remove heat from the power electronics assembly 100. The manifold 104 has a first surface 106 (e.g., first plane) and a second surface 107 (e.g., second plane) positioned opposite the first surface 106. The first surface 106 may define a substantially flat profile. As discussed in greater detail herein, a PCB may be printed upon the first surface 106 (e.g., by three-dimensional printing (3D printing)). This is advantageous as it reduces the thermal resistance of the power electronics assembly 100. In embodiments, the first surface 106 may define a concave or convex profile. In embodiments, the first surface 106 may define cavities or extruding bosses. In these embodiments, a mating surface of the PCB is profiled to receive the profile of the first surface 106.

The manifold 104 includes an inlet 132 (e.g., input port), a heat sink cavity 108, and a heat sink 110. The inlet 132 is configured to receive coolant from a cooling system (not shown). After entering the inlet 132, the coolant interfaces with the heat sink 110 positioned within the heat sink cavity 108. After interfacing with the heat sink 110, the coolant is configured to receive heat from the heat sink 110. The cold plate assembly 102 further includes an outlet 134 (e.g., output port). The warmed coolant exits the cold plate assembly 102 via the outlet 134. In this way, the cold plate assembly 102 is able to cool the power electronics assembly 100. In embodiments, the inlet 132 and the outlet 134 are positioned on opposing sidewalls of the manifold 104. In embodiments, the inlet 132 and the outlet 134 are positioned on the same sidewalls or adjacent sidewalls of the manifold 104. In embodiments, either the inlet 132 and/or the outlet 134 may be positioned on the first surface 106 or the second surface 107 of the manifold 104.

After placing the heat sink 110 into the heat sink cavity 108, a top surface of the heat sink 110 may be flush (e.g., flat, along the same plane) with the first surface 106. This is advantageous as it provides a flush surface for the PCB to be printed upon the power electronics assembly 100. The heat sink 110 may include a plurality of substrate cavities 112 positioned on a top surface of the heat sink 110. Each of the plurality of substrate cavities 112 defines a substrate cavity depth large enough that when components are placed into each of the plurality of substrate cavities 112, a top surface of each of the plurality of substrate cavities 112 may be flush with the first surface 106. This is advantageous as it provides a flush surface for the PCB to be printed upon the power electronics assembly 100.

In some embodiments, the entire power electronics assembly 100 is 3D printed. Due to the self-alignment of the heat sink cavities 108, the substrate cavities 112, and the power device cavities 122, each component has a respective reference point. This results in lower assembly tolerances through the entire assembly. The lower assembly tolerances may result in less misalignment between the 3D printed PCB vias and the electrical pads of the power electronics device. In some embodiments, the entirety of the power electronics assembly 100 may be 3D printed due to there being less variability in the power electronics assembly 100.

Figure 4:
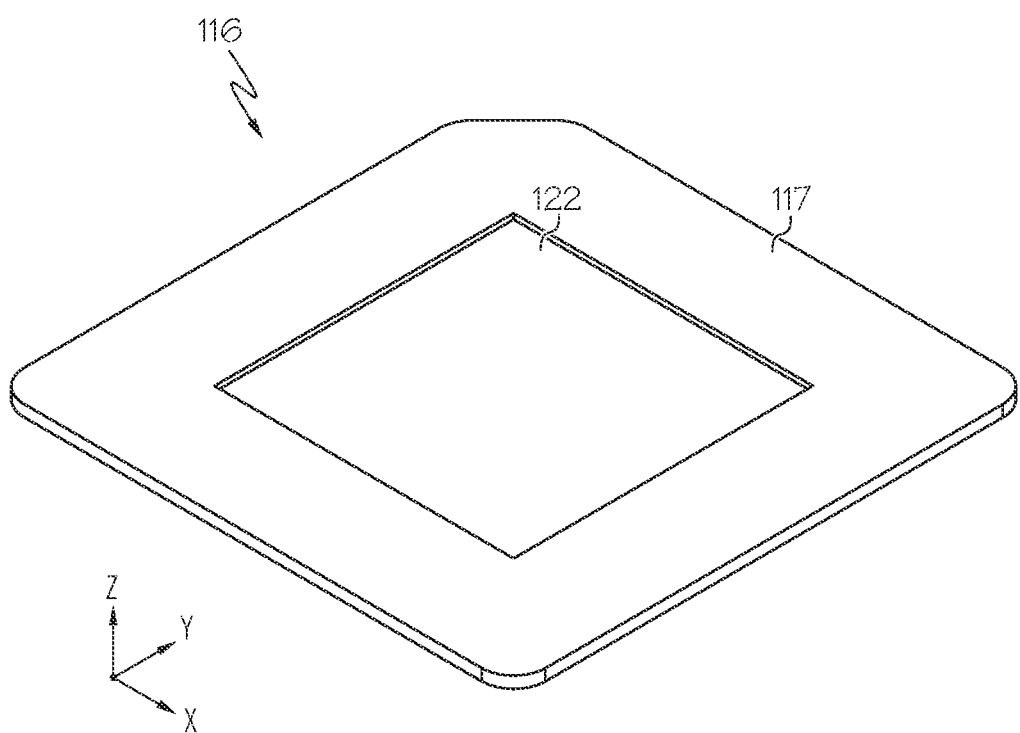
FIG. 4 schematically depicts a perspective view of an S-cell of an embedded power device assembly, according to one or more embodiments shown and described herein.
Figure 5A:
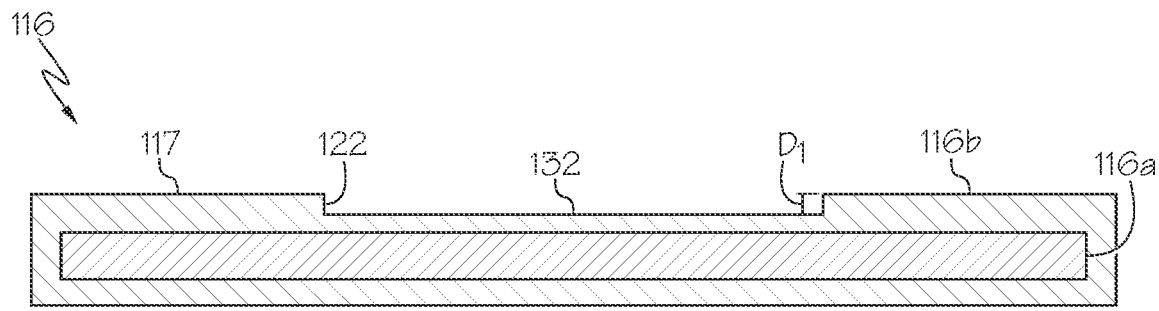
FIG. 5A schematically depicts a side cross-sectional view of an S-cell of an embedded power device assembly, according to one or more embodiments shown and described herein.

Referring now to FIGS. 4 and 5A, an S-cell 116 for a power device assembly 114 is shown. The S-cell 116 includes a base layer 116a constructed at least partially of graphite or a graphite-composite that is encapsulated by a conductive layer 116b. The graphite and graphite-composites provide improved heat spreading to the S-cell 116 due to graphite's high thermal conductivity. Due to the improved heat spreading to the S-cell 116, the S-cell 116 may then transfer more heat to the heat sink 110. This results in improved cooling for each power device assembly 114. Due to this improved cooling, a power output of each power device assembly 114 may be increased. This may result in a more compact size and a higher power density of the power electronics assembly 100. A top surface of the power device cavity 122 defines a thick layer 132 of conductive layer 116b, such that the power device cavity 122 defines a first depth D1. In this way, the electrical conductivity between the power device 126 to the conductive layer 116b may be improved.

In embodiments, the base composition of the graphite or graphite-composite may be re-oriented such that the graphite or graphite-composite has an increased thermal conductivity in the Z-axis (as depicted in FIG. 4). This is advantageous as the direction of the heat transfer may be controlled to increase a rate of cooling of each power device assembly 114. In embodiments, the graphite or graphite-composite may also be re-oriented such that the graphite or graphite-composite has an increased thermal conductivity in the Z-axis and a second axis (e.g., X-axis, or Y-axis as depicted in FIG. 4). In embodiments, the graphite or graphite-composite may be re-oriented such that the graphite or graphite-composite has an increased thermal conductivity in the X-axis and/or the Y-axis. The graphite or graphite-composite may be re-oriented through any known means (e.g., carbonization process, magnetism process).

Conventional systems may have misalignment due to high assembly tolerances. The high assembly tolerances may be a result of a fabrication inaccuracy of the individual components of these conventional systems. Accordingly, these conventional systems may be prone to PCB vias being misaligned to the electrical pads of the power electronic devices, which may prevent PCBs to be 3D printed upon these conventional systems.

In addition to improved thermal spreading, fabrication of the base layer 116a constructed of graphite or graphite-composite may be performed via machining. This may result in reduced fabrication tolerances of the base layer 116a. Additionally, the S-cell 116 disclosed herein is directly referenced to (e.g., aligned to) the manifold 104. This results in the position of each of the plurality of power device assemblies 114 to be known by fixing each of the plurality of power device assemblies 114 to a specified position, which in turn, reduces the overall assembly tolerances of the power electronics assembly 100. This allows for PCBs to be printed directly upon the power electronics assembly 100.

The S-cell 116 further includes the conductive layer 116b as shown in FIG. 5A surrounding the base layer 116a. The conductive layer 116b provides an electric conduit for each of the power device assemblies 114. The conductive layer 116b may be constructed of copper, aluminum or any other suitable electrically conducting material. The conductive layer 116b includes a top layer surface 117 (e.g., top plate) that is substantially flush to the first surface 106 when installed into the manifold 104. The S-cell 116 further includes a power device cavity 122 defined within the top layer surface 117 for housing a power device 126 of the power device assembly 114.

Figure 5B:
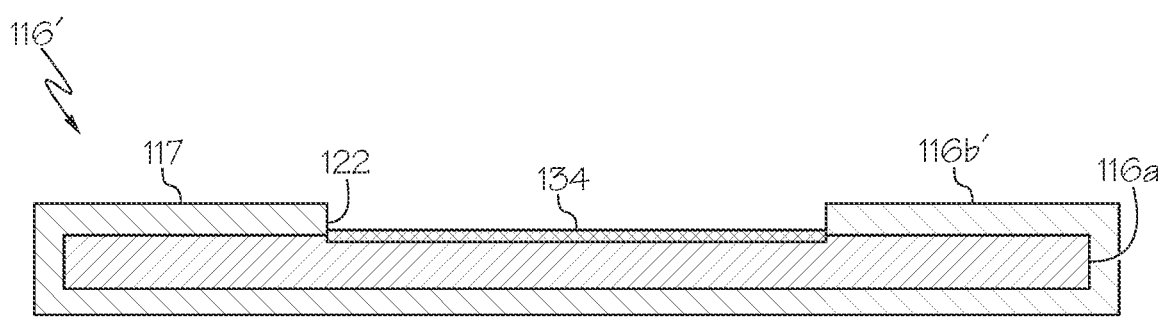
FIG. 5B schematically depicts a side cross-sectional view of an S-cell of an embedded power device assembly, according to one or more embodiments shown and described herein.
Figure 5C:
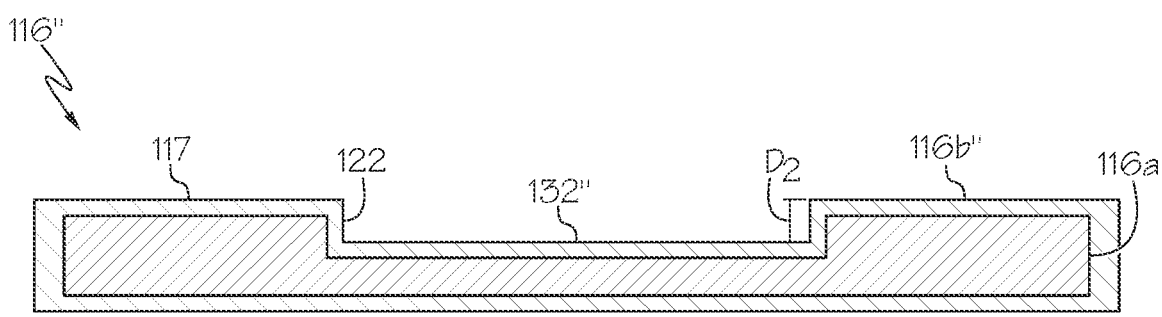
FIG. 5C schematically depicts a side cross-sectional view of an S-cell of an embedded power device assembly, according to one or more embodiments shown and described herein.

Referring now to FIGS. 5A-5C, side, cross-sectional views of the S-cell 116 is shown according to three varying embodiments. In FIG. 5A, a top surface of the power device cavity 122 defines a thick layer 132 of conductive layer 116b, such that the power device cavity 122 defines a first depth D1. In this way, the electrical conductivity between the power device 126 to the conductive layer 116b may be improved.

In FIG. 5B, the conductive layer 116b' does not extend to the top surface of the power device cavity 122. In these embodiments, a conductive coating 134 may be applied on the exposed base layer 116a constructed of graphite or graphite composite. The power device 126 may then be directly bonded to the base layer 116a and the conductive coating 134. In this way, the thermal conductivity from the power device 126 to the conductive layer 116b' may be increased. Additionally, the conductive coating 134 may increase an adhesion between the power device 126 to the S-cell 116'. In these embodiments, the height of the power device 126 and a coating height of the conductive coating 134 are configured such that when the power device 126 is assembled into the power device cavity 122, it is substantially equal to the depth of the power device cavity 122. This results in the top surface of the power device assembly 114 to be flush with the first surface 106.

In FIG. 5C, the surface of the power device cavity 122 defines a thin layer 132" of conductive layer 116b", such that the power device cavity 122 of the S-cell 116'" defines a second depth D2 larger than first depth D1. In this way, the power device 126 provides increased heat spreading to the conductive layer 116b may be increased.

Figure 3:
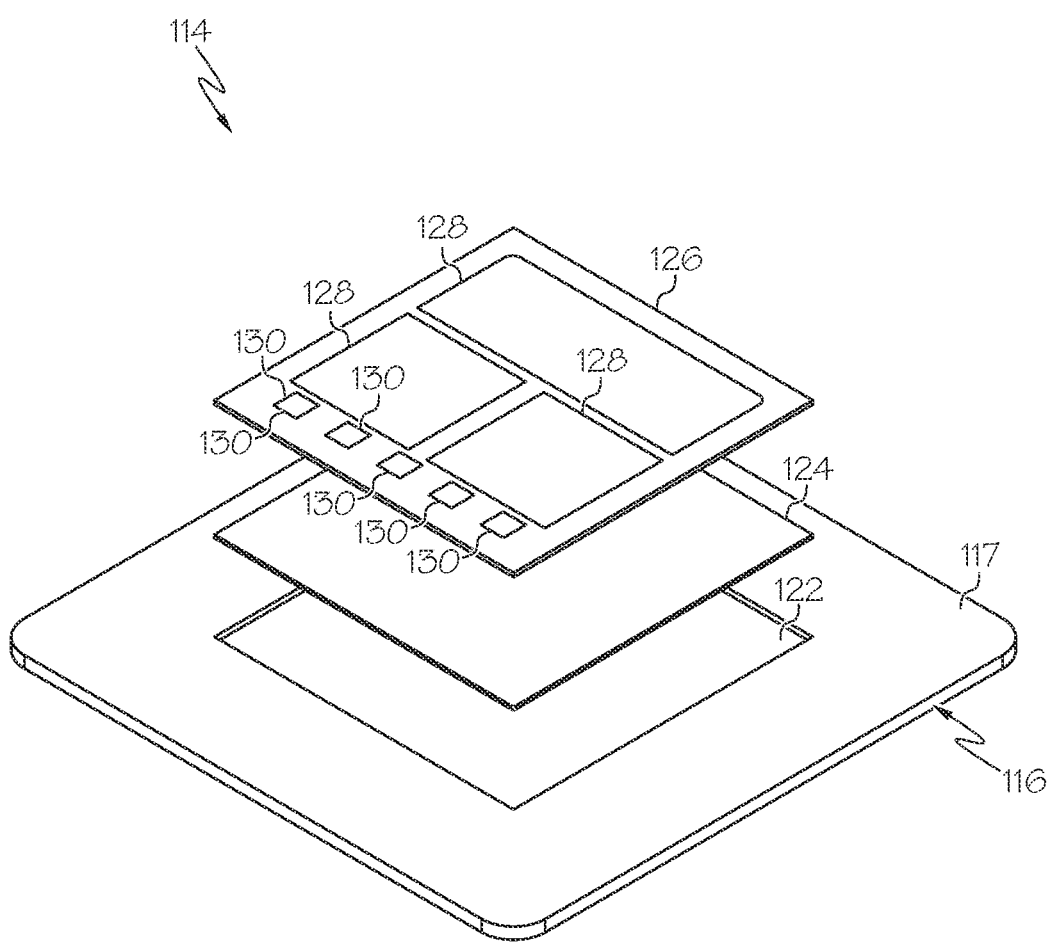
FIG. 3 schematically depicts an exploded, perspective view of a power device assembly, according to one or more embodiments shown and described herein.

Referring now to FIG. 3, the power device assembly 114 is shown in an exploded view, according to various embodiments. The plurality of power device assemblies 114 are embedded (e.g. disposed) onto the plurality of substrate cavities 112. As a non-limiting example, the plurality of power device assemblies 114 may define an inverter circuit for powering an electric device, such as an electric motor. Each of the power device assemblies 114 include a Direct Bonded Metal (DBM) substrate 119 (shown in FIG. 6). The DBM substrate 119 includes a ceramic layer (e.g., alumina) sandwiched (e.g., interposed) between two metal layers (e.g., Cu or Al). The DBM substrate 119 provides electrical insulation for the power device assemblies 114 from each other. Each DBM substrate 119 is bonded to the power device cavity 122 via a first bonding layer (e.g., adhesive layer). The first bonding layer is positioned on a bottom surface and/or side surfaces of the power device cavity 122 and is configured to bond components to the power device cavity 122. The first bonding layer may composed of silver sintering, soldering, Transient Liquid Phase bonding (TLP) or any other suitable bonding material. The S-cell 116 may then be bonded to the DBM substrate 119 via a second bonding layer interposed between the S-cell 116 and the DBM substrate 119.

Each power device assembly 114 further includes the power device 126. The power device 126 may be insulated-gate bipolar transistors (IGBTs), metal-oxide-semiconductor-field-effect-transistors (MOSFETs), or any other suitable power device. The power device 126 is embedded into the power device cavity 122. The power device 126 may be bonded, soldered, adhered to the power device cavity 122 via the bonding layer 124. The power device 126 includes electrical pads 128 to enable power connections for components having high voltage requirements. The power device 126 further includes smaller electrical pads 130 which receives control signals from drivers (e.g., gate drivers) and may provide signals from sensors (e.g., temperature sensors, current sensors) embedded in the power device assembly 114. The power device 126 includes a bottom electrode (not shown) that is that is electrically coupled to the S-cell 116. A power device height of the power device 126 and a bonding height of the bonding layer 124 are configured such that they are substantially equal to the depth of the power device cavity 122. This results in the top surface of the power device assembly 114 to be flush with the first surface 106.

Due to each power device 126 being positioned in one of power device cavities 122, each power device 126 is self-aligned relative to the cold plate assembly 102. In other words, the position of each power device 126 is known by fixing each power device 126 to a specified position. This reduces the overall assembly tolerances of the power electronics assembly 100. Additionally, this arrangement facilitates for PCBs to be 3D printed directly upon the first surface 106. This is due to each power device height of the power electronics assembly 100 being flush relative to the first surface 106 and by having each cavity resulting in the respective component to be self-aligned.

Figure 6:
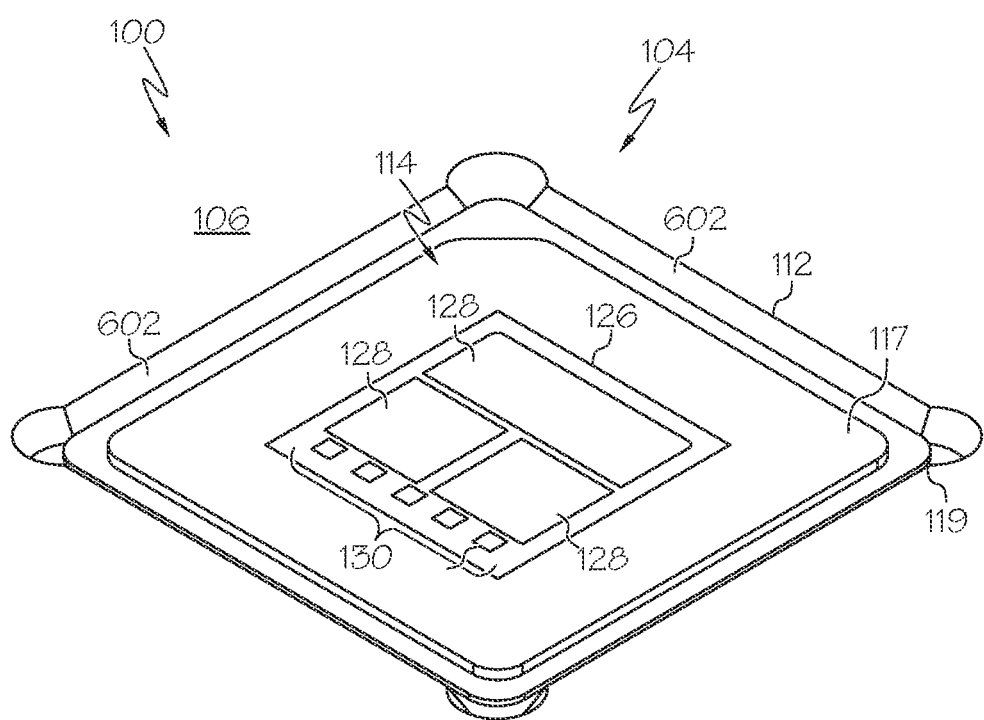
FIG. 6 schematically depicts a detailed view A-A of the power device assembly for the power electronics assembly of FIG. 1, as depicted in FIG. 1.

Referring now to FIG. 6, a perspective view of the power device assembly of FIG. 1, taken from detailed view A-A of FIG. 1, is shown. The power device assembly 114 defines a channel 602 (e.g., space, open area) between a perimeter of the power device assembly 114 and the substrate cavities 112. In embodiments, prior to placing or 3D printing a PCB upon the power electronics assembly 100, the manifold 104 may undergo a reflow process. The reflow process may include applying a reflow fixture that is aligned to the cold plate assembly 102, onto the manifold 104. The manifold 104 may then be reheated so that each of the power device assembly 114 are temporarily movable within each of the substrate cavities 112. Each of the power device assembly 114 may then be moved to align to the reflow fixture. In this way, each of the power device assembly 114 is aligned to the cold plate assembly 102 to compensate any misalignment caused by the DBM substrate 119.

Once the reflow process has been completed, the channel 602 may be filled such that it is flush with the first surface 106. The channel 602 may be filled through a manual filling process or is printed upon by the 3D printer. This is advantageous as it allows the first surface 106 to be flush throughout the entire top surface of the cold plate assembly 102. Additionally, the channel may be filled with a dielectric material, so that each power device assembly 114 may be further electrically insulated from each other.

Figure 7:
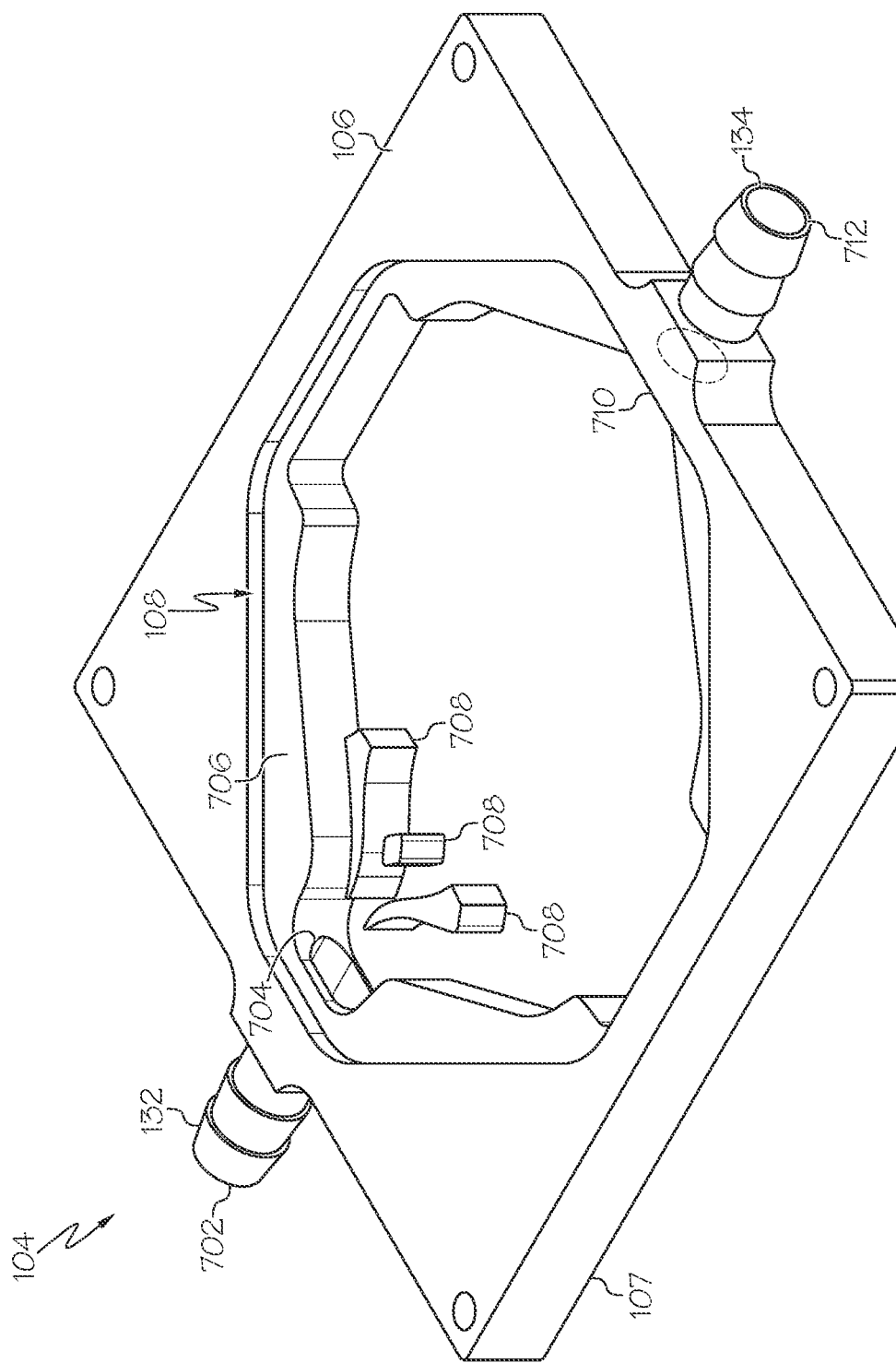
FIG. 7 schematically depicts a perspective view of a manifold for a cold plate assembly, according to one or more embodiments shown and described.

Referring now to FIG. 7, a perspective view of the manifold 104 is shown in an unassembled state. The inlet 132 of the manifold 104 includes an inlet opening 702 and a manifold inlet 704. The inlet 132 receives coolant via the inlet opening 702. As depicted the inlet opening 702 defines a circular shape, however, other geometries (e.g., oval shape, rectangular shape) are contemplated and possible. The inlet 132 provides the coolant to the heat sink cavity 108 via the manifold inlet 704. As depicted the manifold inlet 704 defines an oval shape, however, other geometries (e.g., circular shape, rectangular shape) are contemplated and possible.

The manifold 104 includes a plurality of flow distributors 708. The plurality of flow distributors 708 extend from a bottom surface of the heat sink cavity 108 and are further positioned between the inlet 132 and the outlet 134. Each of the plurality of flow distributors 708 co-operate to direct a coolant flow to predetermined areas of the manifold 104. This is advantageous as the coolant may be directed to areas of the manifold 104 requiring increased cooling. For example, additional coolant may be directed to flow directly beneath a power device assembly 114 operating at a higher voltage relative to other power device assemblies 114. In this way, there may be an overall improved cooling rate from the power device assemblies 114 to the coolant within the manifold 104.

As depicted, the plurality of flow distributors 708 define three flow distributors. However, there may be any number of flow distributors in the plurality of flow distributors 708. As depicted, the plurality of flow distributors 708 are adjacent to the inlet 132. However, the plurality of flow distributors 708 may be positioned at an equitant distance between the inlet 132 and the outlet 134 or may be positioned adjacent to the outlet 134. In embodiments, there are multiple sets of the plurality of flow distributors 708, each positioned at varying points within the manifold 104.

The outlet 134 includes a manifold outlet 710 and an outlet opening 712. After receiving heat from the heat sink 110, the coolant may exit the heat sink cavity 108 via the manifold outlet 710. As depicted the manifold outlet 710 defines an oval shape, however, other geometries (e.g., circular shape, rectangular shape) are contemplated and possible. The coolant may then be provided to a downstream component (not shown) via the outlet opening 712.

The manifold 104 further includes a manifold mating surface 706. The manifold mating surface 706 is profiled such that is may receive the heat sink 110. As depicted, the manifold mating surface 706 defines a flat profile; however, other profiles are contemplated and possible.

Figure 8:
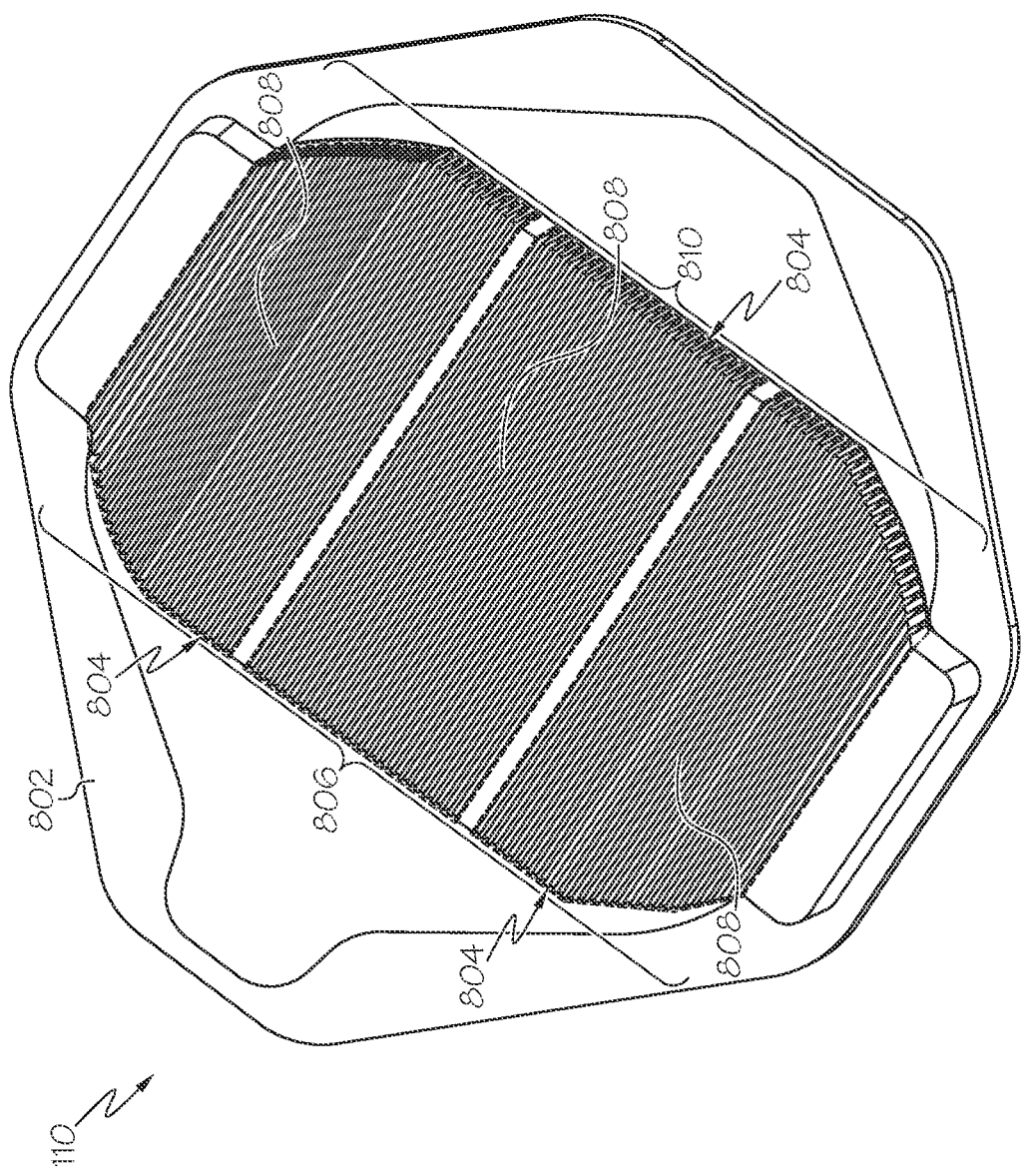
FIG. 8 schematically depicts a bottom perspective view of a heat sink for a cold plate according to one or more embodiments shown and described herein.

Referring now to FIG. 8, a bottom perspective view of the heat sink 110 is shown. The heat sink 110 includes a heat sink mating surface 802. In an assembled state, the heat sink mating surface 802 is in contact with (e.g., rests upon) the manifold mating surface 706. As depicted, the heat sink mating surface 802 defines a flat profile; however, other profiles are contemplated and possible.

The heat sink 110 may include a plurality of channels 804 positioned on a bottom surface of the heat sink 110. As heat is generated by each of the power device assemblies 114, heat is transferred to the heat sink 110. The heat sink 110 transfers the heat to the bottom surface of the heat sink 110 so that the heat may be dissipated by the coolant in the manifold 104. The plurality of channels 804 extend along a width of the heat sink 110 and interface with the coolant within the manifold 104. Each of the plurality of channels 804 includes a channel inlet 806, a channel 808, and a channel outlet 810.

The plurality of flow distributors 708 may co-operate with the plurality of channels 804 to enhance the cooling capacity of the cold plate assembly 102. For example, after coolant enters the heat sink cavity 108, each of the plurality of flow distributors 708 may distribute the coolant to a respective set of the plurality of channels 804. The coolant then enters each respective set of the plurality of channels 804 via the channel inlets 806. The coolant then interfaces with the heat sink 110 to absorb heat via the channels 808. The coolant exits each respective set of the plurality of channels 804 via the channel outlets 810. In this way, the flow path of the coolant may be further controlled to enhance the cooling capabilities of the cold plate assembly 102.

From the above, it is to be appreciated that defined herein are embodiments generally directed to power electronics assemblies having S-cells constructed at least partially of graphite or graphite-composite. The S-cell has a power device cavity where a power electronics device is placed. Due to the S-cell being constructed at least partially of graphite or graphite-composite, the power electronics device is able to spread more heat to the S-cell and is able to cool more effectively when compared to conventional approaches. Additionally, due to the S-cell being constructed at least partially of graphite or graphite-composite, the S-cell defines more precise tolerancing, resulting in less assembly misalignment when compared to conventional approaches. The power device cavity is designed so that a top surface of the power electronics device is flush with a top surface of the cold plate assembly, while allowing the power electronics device to be electrically coupled to a bottom electrode of the S-cell. The flat surface allows for a printed circuit board (PCB) to be printed directly upon the cold plate assembly. Due to the proximity of the heat-generating power electronics device to the cold plate there may be improved cooling for the power electronics assembly. This allows for the power electronics device to output higher power, while maintaining a compact package size.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

It will be apparent to those skilled in the art that various modifications and variations can be made to the embodiments described herein without departing from the scope of the claimed subject matter. Thus, it is intended that the specification cover the modifications and variations of the various embodiments described herein provided such modification and variations come within the scope of the appended claims and their equivalents.

What is claimed:

1. A power electronics assembly comprising:
   a cold plate assembly comprising:
      a manifold comprising a heat sink cavity in a first surface; and
      a heat sink comprising one or more substrate cavities, wherein the heat sink is disposed in the heat sink cavity; and
   one or more power device assemblies disposed within the one or more substrate cavities, each power device assembly of the one or more power device assemblies comprising:
      an S-cell comprising:
         a base layer constructed at least of graphite or a graphite-composite,
         a conductive layer at least partially surrounding the base layer; and
         a power device cavity;
      a power device disposed in the power device cavity, the power device being electrically coupled to the conductive layer; and
      a direct bonded metal (DBM) substrate bonded to the S-Cell.

2. The power electronics assembly of claim 1, further comprising a conductive coating disposed at least partially between the power device cavity and the power device, the conductive coating defining a coating height, wherein:
   each of the one or more substrate cavities defines a substrate cavity depth,
   the power device defines a power device height, and
   the substrate cavity depth is substantially equal in value to the power device height with the conductive coating.

3. The power electronics assembly of claim 1, further comprising a bonding layer disposed at least partially between the power device cavity and the power device, the bonding layer defining a bonding height, wherein:
   each of the one or more substrate cavities defines a substrate cavity depth,
   the power device defines a power device height, and
   the substrate cavity depth is substantially equal in value to the power device height with the bonding layer.

4. The power electronics assembly of claim 1, wherein the DBM substrate is constructed of an electrically insulating material.

5. The power electronics assembly of claim 1, wherein the power device cavity is shaped and sized to receive the power device.

6. The power electronics assembly of claim 1, wherein a top surface of the S-cell is substantially on a same plane as a top surface of the power device.

7. The power electronics assembly of claim 1, wherein:
   the first surface is substantially on a same plane as a top surface of the power device,
   the S-cell and the power device define a channel extending around a perimeter of the power device;

the cold plate assembly is configured for the channel to be printed upon until a top surface of the channel is on the same plane as the first surface; and the cold plate assembly is configured for a printed circuit board to be printed upon the first surface.

8. The power electronics assembly of claim 7, wherein material printed upon the channel is constructed of a dielectric material.

9. The power electronics assembly of claim 1, further comprising:

an inlet of the manifold configured to receive a coolant;

an outlet of the manifold configured to provide the coolant, the outlet being fluidly coupled to the inlet; and a plurality of flow distributors disposed between the inlet and the outlet, the plurality of flow distributors further disposed fluidly downstream of the inlet, the plurality of flow distributors being configured to distribute flow of the coolant downstream of the inlet.

10. A power device assembly comprising:

an S-cell comprising a base layer constructed at least of graphite or a graphite-composite, a conductive layer at least partially surrounding the base layer, and one or more power device cavities;

one or more power devices each disposed in one of the one or more power device cavities, each of the one or more power devices being electrically coupled to the conductive layer; and a direct bonded metal (DBM) substrate bonded to the S-cell.

11. The power device assembly of claim 10, further comprising a first surface of a heat sink, wherein the DBM substrate is disposed in a heat sink cavity on the first surface.

12. The power device assembly of claim 11, wherein the first surface is substantially on a same plane as a top surface of the power device assembly.

13. The power device assembly of claim 11, wherein the S-cell and each of the one or more power devices define a channel extending around a perimeter each of the one or more power devices, and wherein the channel is printed upon until a top surface of the channel is substantially on the same plane as the first surface.

14. The power device assembly of claim 13, wherein material printed upon the channel is constructed of a dielectric material.

15. The power device assembly of claim 10, wherein each of the one or more power device cavities is shaped and sized to receive a power device of the one or more power devices.

16. The power device assembly of claim 10, wherein a top surface of the S-cell is substantially in a same plane as a top surface of the power device assembly.

* * * * *